United States Patent [19]

Pace

[11] 4,385,394
[45] May 24, 1983

[54] UNIVERSAL INTERFACE FOR DATA COMMUNICATION SYSTEMS

[75] Inventor: Roger D. Pace, Detroit, Mich.

[73] Assignee: Datavision, Inc., Roseville, Mich.

[21] Appl. No.: 227,862

[22] Filed: Jan. 23, 1981

[51] Int. Cl.³ .............................................. H03K 4/94
[52] U.S. Cl. ..................................... 375/36; 307/268;
  178/63 R; 328/135
[58] Field of Search ............... 375/8, 36; 370/24, 27,
  370/32; 371/68, 70; 307/228, 261, 263, 268;
  328/135, 146, 147; 330/69, 84, 124 R, 251, 263;
  178/63 R; 455/608, 607

[56] References Cited

U.S. PATENT DOCUMENTS

| | | | |
|---|---|---|---|
| 3,671,671 | 6/1972 | Watanabe | 375/36 |
| 3,868,519 | 2/1975 | Green | 375/36 |
| 4,047,122 | 9/1977 | Rao | 330/124 R |
| 4,052,611 | 10/1977 | Fish | 455/608 |

FOREIGN PATENT DOCUMENTS 2443770  8/1980  France .................... 375/36

Primary Examiner—Benedict V. Safourek
Assistant Examiner—Stephen Chin
Attorney, Agent, or Firm—Cullen, Sloman, Cantor, Grauer, Scott & Rutherford

[57] ABSTRACT

A system for transmitting and receiving serial data over a pair of differential lines so that relatively large differences in ground potential will not affect the integrity of the transmitted data. Each differential line has a first switch for pulling the line high and a second switch for pulling the line low. Logical gates hold all switches off to allow the lines to float in response to a first control signal. A second control signal enables the logical gates to pull the first differential line up and the second differential line down whenever true data is to be sent and for pulling the second differential line up and the first differential line down whenever $\overline{\text{data}}$ is true. Associated with each switch is a protective diode and cold filament lamp for protecting the respective switch and insuring system operation even if large swings in ground potential occur. A differential amplifier has one input resistively coupled to the first differential line and a second input resistively coupled to the second differential line. A pair of matched resistors are coupled between the inputs of the differential amplifier and a reference point so that the values of the resistors establish the rail-to-rail operating range of the system. Various resistors at the input of the amplifier enable the data to be determined by differences in the currents in the first and second differential lines and not by the difference between a signal and local ground.

12 Claims, 2 Drawing Figures

UNIVERSAL INTERFACE FOR DATA COMMUNICATION SYSTEMS

BACKGROUND OF THE INVENTION

This invention relates to a differential line system for sending and receiving serial data. Many data transfer systems are currently in use, and most send a signal which is referenced to ground at the sending location and then the received signals are reconstructed with reference to ground at the receiver location. The two grounds are seldom the same and therefore the information conveyed in the transmitted signals is subject to error.

The ground potential in the basement of a typical high-rise office building may vary significantly with respect to ground potential at the top floor. Similarly, when transmission lines are long, great differences in ground potential can and often do occur. In such instances, significant errors can result when the received data is reconstructed for use.

The present invention utilizes a pair of differential lines for data transfer and reconstructs the data by measuring a current difference between the differential lines rather than the voltage difference measured with respect a ground.

More particularly, the present invention utilizes a pair of differential lines, interfacing the sending end of the differential lines with serial data out and control signals and for interfacing the receiver end of the differential lines with a serial data input.

The interface circuitry at the transmitting end of the differential lines enables highly reliable data signals to be sent over the differential lines and the receiver interface insures that the transmitted signals are accurately reconstructed to provide accurate serial data into the receiver station regardless of even relatively large variations in ground potential between sending and receiving locations.

DETAILED DESCRIPTION OF THE PREFERRED EMBODIMENT

Figure 1:
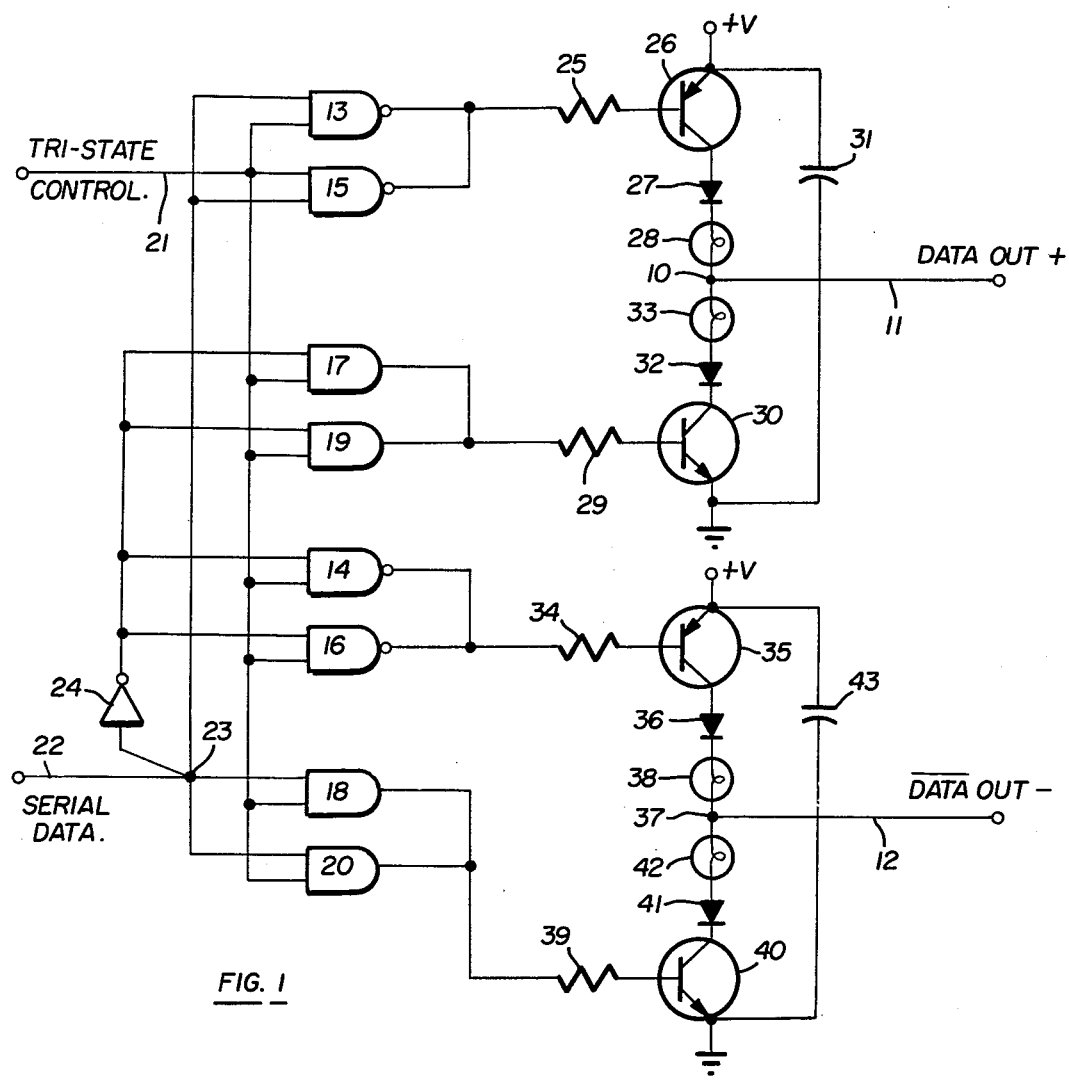
FIG. 1 is an electrical circuit diagram illustrating the circuitry for driving the output end of the pair of differential lines in response to serial data signals.
Figure 2:
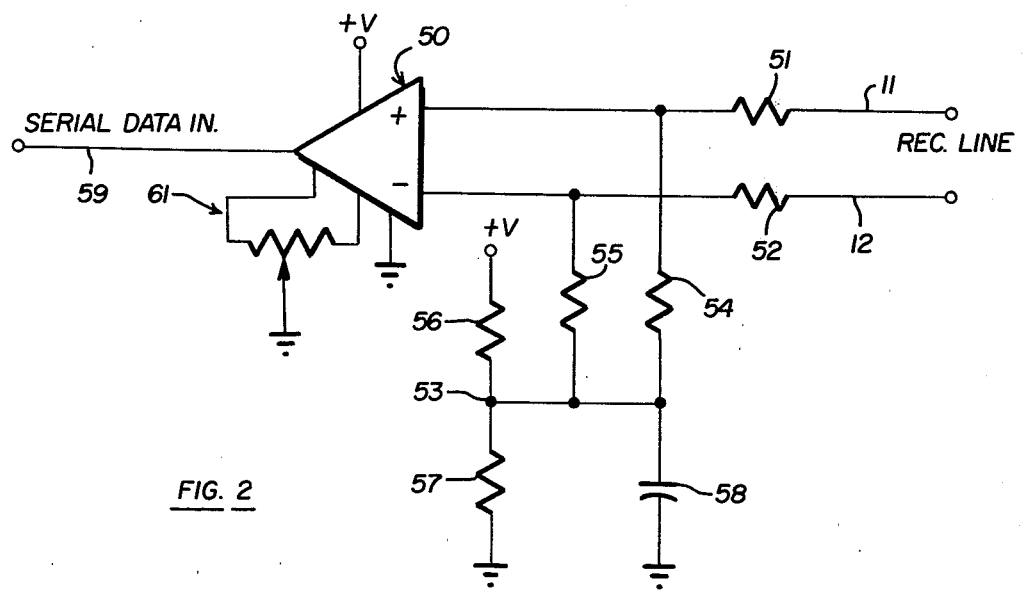
FIG. 2 is an electrical schematic diagram of the interface circuitry at the receiver end of the pair of differential lines which convert the differential signals to serial data in signals for use at the receiver station.

The preferred embodiment of the present invention, as illustrated in FIGS. 1 and 2 of the drawings, shows a data transfer system utilizing a pair of differential lines and appropriate interface circuitry at both the sending and the receiving ends of the differential lines. FIG. 1 shows the interface circuitry between a source of serial data and control signals located at the sending end of the differential lines. The control signal and serial data are supplied to the gating network and the output of the logical gates is used to drive the pair of differential lines 11, 12, respectively.

The logical gating circuitry of FIG. 1 includes a first pair of logical NAND gates 13, 15 and a second pair of logical NAND gates 14, 16. The logical gating network further includes a first pair of logical AND gates 17, 19 and a second pair of logical AND gates 18, 20. Each of the logical gates has two inputs and an output. A control signal (in the preferred embodiment, a tri-state control signal) is generated by any conventional means at the sending station and supplied via lead 21 to one input of each of the logical gates 13 through 20.

Serial data generated by any conventional means at the sending location is supplied to the interface circuitry via lead 22 to input node 23. Node 23 is connected to a second input of each of the NAND gates 13, 15 and to the second inputs of each of the AND gates 18, 20. Similarly, the serial data input node 23 is connected to the input of an inverter 24 whose output supplies $\overline{data}$ to the second inputs of the second pair of logical AND gates 17, 19 into the second input of each of the second pair of logical NAND gates 14, 16.

The output of the first pair of logical NAND gates 13, 15 are commonly connected together and are coupled through a resistor 25 to the base electrode of a first PNP transistor 26. The PNP transistor 26 has its emitter connected to a source of positive potential and its collector connected to the anode of a first diode 27 whose cathode is connected to one terminal of a cold filament electric light bulb 28. The opposite terminal of the light bulb 28 is connected to a positive data output node 10 which outputs a signal to the first differential output line 11.

The outputs of the first pair of logical AND gates 17, 19 are commonly connected together and supplied through a resistor 29 to the base of a NPN transistor 30. The emitter of the NPN transistor 30 is connected to ground and to the emitter of the first PNP transistor 26 via capacitor 31. The collector of NPN transistor 30 is connected to the cathode of a second diode 32 whose anode is connected to one terminal of a second cold filament electric light bulb 33. The second terminal of the light bulb 33 also connects to the positive data output node 10 which supplies the "high" or "low" positive data out signals to the first differential output line 11.

Similarly, the outputs of the second pair of logical NAND gates 14, 16 are commonly connected together and the common connection is connected through a resistor 34 to the base electrode of a second PNP transistor 35. The emitter of transistor 35 is connected directly to a source of positive potential while the collector is connected to the anode of a third diode 36. The cathode of diode 36 is connected to a second or negative output node 37 through a third cold filament light bulb 38. The negative data output node 37 supplies a signal to the $\overline{data}$ out or second differential line 12.

The output of the second logical AND gates 18, 20 are commonly connected together and then through a resistor 39 to the base electrode of a second NPN transistor 40. The emitter of the transistor 40 is connected directly to ground and through a capacitor 43 is connected to the emitter of transistor 35. The collector of transistor 40 is connected to the cathode of a fourth diode 41. The anode of diode 41 is connected through a fourth cold filament electric light bulb 42 to the negative data output node 37.

In the embodiment of the interface circuitry of FIG. 1, the AND gates 17, 18, 19, 20 and the NAND gates 13, 14, 15, 16 are CMOS gates having both an active HIGH state and an active LOW state. The diodes 27, 32, 36, and 41 insure that at least a finite voltage drop of approximately two volts exist between the output transistors 26, 30, 35 and 40 and the lines 11, 12 for protecting those transistors even if the power is turned off or switched to a high impedance state. The diodes insure that the transmission lines can still swing the full voltage. In other words, the diodes 27, 32, 36 and 41 insure that there is no way to load the line with more than a few micro amps of current. The cold filament electric light bulbs 28, 32, 38, and 42 serve as temperature compensation means. These light bulbs effectively act as temperature-compensated resistors, and they also serve to absorb current surges which could otherwise harm the output transistors.

The operation of the output interface circuit of FIG. 1 will now be briefly described. Wherever the tri-state control signal on lead 21 is in a high impedence state, a low is provided to one input of each of the gates 13 through 20. With a low at any input of NAND gates 13, 15 and 14, 16 their outputs will go high. A high signal is supplied to the base of PNP transistors 26 and 35 will turn the transistors 26, 35 off. Similarly, the low at the first input of logical AND gates 17, 19 and 18, 20 will cause their outputs to go low and when this low signal is supplied to the base of transistors 30 and 40, transistors 30 and 40 will be turned off. Therefore, whenever the control lead carries a high impedance control signal (a "low") all four of the drive transistors 26, 30, 35 and 40 are turned off causing the differential output lines 11, 12 to "float" regardless of the status of the data signals.

Conversely, whenever the tri-state control signal on lead 21 goes high, each of the gates 13 through 20 are enabled and their outputs will be determined by the state of the serial data on line 22. The serial data from the input node 23 is connected to the second inputs of the logical NAND gates 13, 15 and the second input of the second pair of logical AND gates 18, 20. When serial data is true, indicating a logical "1" or high signal, the enabled NAND gates 13, 15 have a high signal present at both of their inputs and this causes their output to go low. The low at the output of NAND gates 13, 15 which is supplied to the base of PNP transistor 26 through resistor 25, causes transistor 26 to switch to a conductive state. With transistor 26 on, the source of positive potential is applied to the output node 10 via the conducting transistors 26, diode 27, and the light bulb 28. While transistor 26 conducts, node 10 and therefore the first differential output line 11 will be pulled high. The node 10 cannot be pulled low since transistor 30 remains non-conductive. The positive or true data signals at the input node 23 are inverted by inverter 24 to supply low signals to one input of the logical AND gates 17 causing the output to go low to insure that transistor 30 remains non-conductive.

Simultaneously, the high or true data signal at node 23 is supplied to the second inputs of logical AND gates 18, 20 causing their outputs to go high. With a high supplied to the base of NPN transistor 40 through resistor 39, transistor 40 will conduct and provides a ground path for node 37. The second differential output line 12 is therefore pulled low through node 37, the light bulb 42, diode 41 and the conducting NPN transistor 40. Therefore, whenever true data is received on the serial data line 22, the logical gating network comprising gates 13 through 20 output a second set of gating signals which hold transistors 30 and 35 non-conductive while allowing transistor 26 to pull the first differential data line 11 high while transistor 40 conducts to pull the second differential output line 12 low toward ground.

Conversely, whenever $\overline{data}$ is received at node 23, the low signal supplied to the second inputs of NAND gates 13, 15 will cause a high signal to be passed through resistor 25 to the base of PNP transistor 26. A high signal at the base of transistor 26 shuts the transistor off. Simultaneously, the low signal at the inputs of AND gates 18, 20 cause their outputs to go low to insure that transistor 40 remains non-conductive. However, the $\overline{data}$ signal at node 23 is inverted by inverter 24 to provide a high signal to the second inputs of NAND gates 14, 16. With a high at both inputs, the NAND gates 14, 16 outputs a low signal through resistor 34 to the base of the PNP transistor 35 switching transistor 35 to a conductive state. With transistor 35 conducting, the second differential output line 12 will be pulled high via node 37, light bulb 38, diode 36, and the conducting PNP transistor 35. Simultaneously, the high signal from the output of inverter 24 is supplied to the inputs of AND gates 17, 19 causing their outputs to go high. The high at the output of AND gates 17, 19 is supplied through a resistor 29 to the gate electrode of the NPN transistor 30 causing it to conduct. With transistor 30 conducting, the first differential output line 11 is pulled low via node 10, light bulb 33, diode 32, and the conducting NPN transistor 30.

Therefore, it can be said that the logical gates 13 through 20 control the way in which the differential output lines 11, 12 are driven. The logical gates 13 through 20 respond to a first condition whenever the tri-state control signal on line 21 is low so that the gates 13 through 20 output a first set of gating signals for insuring that all of the output transistors 26, 30, 35 and 40 remain non-conductive thereby allowing the differential output lines 11 and 12 to "float."

Further, whenever the tri-state control signal is high, each of the gates 13 through 20 are enabled and will generate gated signals depending upon the state of the serial data. When the serial data is true, NAND gates 13, 15 cause PNP transistor 26 to conduct and pull the first differential output line high while the AND gates 18, 20 can pass a high signal to switch transistor 40 on thereby pulling the second differential output lead low. Lastly, whenever the serial data received at node 23 is $\overline{data}$, the output of NAND gates 14, 16 will go low causing PNP transistor 35 to conduct to pull the second differential output line 12 high while the output of AND gate 17, 19 goes high to turn the NPN transistor 30 on so as to pull the first differential output line 11 toward ground.

It is to be understood, that the transistor pairs could be reversed or that single gates could replace the gate pairs described, if desired. Regardless, the interfacing circuitry of FIG. 1 can be used to convert serial data into a differential signal which is transmitted over a pair of differential lines 11, 12 to a receiver station. The receiver station is then interfaced between the differential lines 11, 12 and the utilization device or storage media requiring the serial data input.

The interface at the receiver end of the differential pair comprising lines 11, 12 will now be described with reference to FIG. 2. In FIG. 2, the first differential line 11 is connected to the non-inverting input of a differential amplifier 50 through a resistor 51. The second differential line 12 is connected to the inverted input of the differential amplifier 50 through a resistor 52. The non-inverting input of differential amplifier 50 is also connected to a reference node 53 through a resistor 54, and the inverted input of amplifier 50 is connected through a resistor 55 to the voltage reference node 53.

Node 53 is connected through a resistor 56 to a positive source of potential and through a resistor 57 to ground so as to establish a voltage divider comprising resistors 56, 57 with their junction serving as the voltage reference point 53. Node 53 is further connected to ground through capacitor 58. The output of the differential amplifier 50 is determined by the difference between the signals on the differential lines 11, 12 with respect to one another. The output of the interface circuitry is lead 59 which supplies the reconstructed data signals to whatever utilization exists at the receiver station. Since data is determined by the differences in current on the two differential lines and not by differences with respect to a varying ground, highly accurate data is reconstructed.

The potentiometer 61 is connected to the biasing inputs of amplifier 50 so that when the inputs 11, 12 are shorted, the potentiometer is adjusted so that the amplifier output on lead 59 is normally high.

The operation of the receiver interface circuitry of the data transfer system of the present invention will now be described with reference to FIG. 2. The data is received as a difference signal between the differential lines 11 and 12. A first pair of resistors 51, 52 serve to isolate the amplifier inputs from the lines 11, 12. In the preferred embodiment of the present invention, the values of resistors 51 and 52 are approximately equal and the value of resistors 54 and 55 are equal. Resistors 51 and 54 comprise a first matched pair of resistors while resistors 52 and 55 constitute a second matched pair. The ratio of the resistor 51 to resistor 54 and similarly of resistor 52 to resistor 55 determine the rail-to-rail range of operation of the amplifier 50.

The voltage reference potential established at node 53 by the resistors 56, 57 which, in the preferred embodiment of the present invention has six volts, times the ratio of the resistors 51 and 55 determine the amount of ground swing which can be tolerated by the system. Theoretically, in the preferred embodiment wherein a six volt reference was established and the ratio of resistor 51 to resistor 54 was approximately eight, the system should tolerate a shift in ground potential of as much as 48 volts. Practically, however, the system will more likely tolerate shifts in ground potential of as much as 20 to 30 volts thereby insuring highly accurate data.

The amplifier 50 measures the difference between the signals on the differential lines 11, 12 by measuring current differences and these differences are used to "produce serial data in" signals which are supplied from the output of amplifier 50 to a lead 59. Even if large differences of potential exist, such as between the top and bottom floors of the building or between a remote station and receiver connected by thousands of feet of line, the interface circuitry of the present invention will insure that the data communication system is able to tolerate even large swings in ground potential and reconstruct, with accuracy, the serial data which was originally generated at the transmitting or output station.

The foregoing is a description of the preferred embodiment of the present invention and, as known in the art, various changes may be made in the circuitry illustrated and in the uses described without departing from the spirit and scope of the present invention which is limited only by the appended claims.

I claim:

1. In a system for transmitting serial data and serial data from one location to another via a pair of differential output lines and including means for generating a control signal, the improvement comprising:

gating means operatively coupled to receive said serial data, said serial data, and said control signal for generating a first set of gating signals whenever said control signal is in a first state and for generating a second set of signals whenever said control signal is in a second state and said data is true, and for generating a third set of gating signals whenever said control signal is in said second state and said data is true; and output means including a first output control circuit for driving a first of said differential output lines and a second output control circuit for driving a second of said differential output lines, said output means being responsive to said first set of gating signals for driving neither of said first and second differential output lines so as to allow said lines to float, said output means being responsive to said second set of gating signals for pulling said first differential output line high and said second differential output line low and said output means being responsive to said third set of gating signals for pulling said second differential output line high and said first differential output line low thereby enabling data transfer which is relatively immune from even large shifts in ground potential.

2. The improved data transfer system of claim 1 wherein said first output control circuit includes a first switching means operatively coupled between a source of potential and said first differential output line and a second switching means operatively coupled between said first differential output line and ground, and said source of potential connected to ground, said second output control circuit includes a third switching means operatively coupled between said source of potential and said second differential output line and a fourth switching means operatively coupled between said second differential output line and ground, said output means being responsive to said first set of gating signals for holding all of said switching means non-conductive to allow said differential output lines to float, said first and fourth switching means being responsive to said second set of gating signals to pull said first differential output line high and said second differential output line low, and said second and third switching means being responsive to said third set of gating signals for pulling said first differential output line low and said second differential output line high.

3. The improved data transfer system of claim 2 wherein said output means includes means for protecting said switching means from reverse bias while insuring a finite voltage drop between said first switching means and said first differential line, between said second switching means and said first differential line, between said third switching means and said second differential line, and between said fourth switching means and said second differential line, said output control means further including temperature-compensated resistive means for protecting said switching means from current surges or the like.

4. The improved data transfer system of claim 2 wherein said first and third switching means includes first and second PNP transistors and each of said second and fourth switching means includes first and second NPN transistors, and wherein said output control means further includes first, second, third and fourth diode means, and first, second, third and fourth cold filament electric lighting means, and wherein said output control means further includes means for connecting the emitter of the first PNP transistor to a source of potential, means for connecting the collector of said first PNP transistor to the anode of said first diode means, means for connecting the cathode of said first diode means to one terminal of said first electric lighting means, and means for connecting the opposite terminal of said first electric lighting means to said first differential output line, means for connecting the emitter of said first NPN transistor to ground and said source of potential connected to ground, said output means further including means for connecting the collector of the first NPN transistor to the cathode of said second diode means, means for connecting the anode of said second diode means to one terminal of said second lighting means, and means for connecting the opposite terminal of said second electrical lighting means to said first differential output line;

said output control means additionally including means for connecting the emitter of the second PNP transistor to a source of potential, means for connecting the collector of said second PNP transistor to the anode of said third diode means, means for connecting the cathode of said third diode means to one terminal of a third electric lighting means, and means for connecting the opposite terminal of said third electric lighting means to said second differential output line;

means for connecting the emitter of the second NPN transistor to ground, means for connecting the collector of said second NPN transistor to the cathode of said fourth diode means, means connecting the anode of said fourth diode means to one terminal of said fourth electric lighting means and means for connecting the opposite terminal of said fourth electric lighting means to said second differential output line and said source of potential connected to ground, said first, second, third, and fourth switching means corresponding to said first PNP transistor, said first NPN transistor, said second PNP transistor and said second NPN transistor, respectively, and being responsive to said first, second, and third sets of gating signals for floating said first and second differential output lines, for pulling one of said lines high while the other is pulled low and vice versa.

5. The improved data transfer system of claim 4 wherein said logical gating means includes at least one NAND gate having its output operatively coupled to the base electrode of said first PNP transistor, a logical AND gate having its output operatively connected to the base of said first NPN transistor, a second logical NAND gate having its output operatively connected to the base of said second PNP transistor and a second logical AND gate having its output operatively connected to the base of said second NPN transistor, one input of each of said logical gates being operatively coupled to said source of control signals so that when said control signal is in a first state both of the first and second NAND gates will produce a high output to turn off the first and second PNP transistors while each of the AND gates will have a low output to maintain the first and second NPN transistors off thereby allowing said first and second differential output lines to float, each of said AND gates and said NAND gates being enabled by the presence of a high control signal so that their output will be determined by the state of the data signal at the other input, said serial data or serial $\overline{\text{data}}$ being connected to the second input of the first NAND gate and the second AND gate while the inverse of said serial data or serial data is supplied to the second input of the first AND gate and the second NAND gate, said logic gates being enabled by the logically high control signal such that whenever true data is to be transmitted the first NAND gate output will go low, causing the first PNP transistor to conduct and pull the first differential output line high while the second AND gate output goes high to switch on the second NPN transistor to pull the second differential output line low, said first AND gate and said second NAND gate being responsive to the inverse of $\overline{\text{data}}$ for turning on the second PNP transistor and the first NPN transistor on so as to pull the second differential output line high and the first differential output line low.

6. In a data transfer system including a means for generating serial data and serial $\overline{\text{data}}$, means for generating a control signal having at least first and second control states, first and second differential lines for transmitting data from one location to another and means for receiving serial data, the improvement comprising:

gating means responsive to said first control state for generating a first set of gated signals, for generating a second set of gated signals whenever said control signal is in said second state and the data is true, and for generating a third set of gated signals when said control signal is in said second state and said $\overline{\text{data}}$ is true;

first line driver means operatively coupled to said first differential line and responsive to said second set of gated signals for outputting a relatively "high" signal on said first differential line and responsive to said third set of gated signals for outputting a relatively "low" signal on said first differential line;

second line driver means operatively coupled to said second differential line and responsive to said second set of gated signals for outputting a relatively "low" signal on said second differential line and responsive to said third set of gated signals for outputting a relatively "high" signal on said second differential line;

both of said first and second line driver means being responsive to said first set of gated signals for allowing both said first and second differential lines to float;

said means for receiving serial data including means for reconverting the differential signal transmitted by said first and second differential lines back into serial data, said receiver means including a differential amplifier having first and second inputs, a first resistive means for coupling said first differential line to a first input of said differential amplifier while isolating said amplifier from ground, a second resistive means coupling said second differential line to the second input of said differential amplifier for isolating said amplifier from ground, voltage divider means for establishing a reference potential, third resistive means coupled between the first input of said amplifier and said established voltage reference point, and a fourth resistive means coupled between said second input of said differential amplifier means and said established voltage reference point such that the differential signal received at the inputs of said differential amplifier is accurately reconverted into serial data without regard to even wide fluctuations in ground potential.

7. The improved data transfer system of claim 6 wherein said first line driver means includes a first switching means operatively coupled between a source of potential and said first differential output line, a second switching means operatively coupled between ground and said first differential output line and said source of potential connected to ground; said second line driver means further including a third switching means operatively coupled between said source of potential and said second differential output line and a fourth switching means operatively coupled between said second differential output line and ground, said switching means being responsive to said first set of gated signals for allowing the first and second differential output lines to float, being responsive to said second set of gated signals for pulling the said first differential output line high and said second differential output line low, and responsive to said third set of gated signals for pulling said second differential output line high and said first differential output line low.

8. The improved data transfer system of claim 7 wherein said first line driver means further includes protective means operatively coupled between said first switching means and said first differential output line and between said second switching means and said first differential output line, said second line driver means further including protective means operatively coupled between said third switching means and said second differential output line and between said fourth switching means and said second differential output line.

9. The improved data transfer system of claim 7 wherein said first and third switching means each comprise a PNP transistor, wherein each of said second and fourth switching means comprise an NPN transistor, and wherein each of said protective means includes a diode, said first PNP transistor having its emitter operatively coupled to said source of potential and its collector operatively coupled to the anode of a first protective diode, the cathode of said first diode being operatively coupled to said first differential output line, said first NPN transistor having its emitter operatively coupled to ground and its collector operatively coupled to the cathode of a second protective diode whose anode is operatively coupled to said first differential output line, said second PNP transistor having its emitter operatively coupled to said source of potential and its collector operatively coupled to the anode of a third protective diode whose cathode is operatively coupled to said second differential output line, said second NPN transistor having its emitter operatively coupled to ground and its collector operatively coupled to the cathode of a fourth protective diode whose anode is operatively coupled to said second differential output line, such that when said first set of gated signals are applied to the bases of said transistors, no transistor will be turned on thereby enabling the first and second differential output lines to float, said transistors being responsive to said second set of data signals for turning on said first PNP transistor and said second NPN transistor for pulling the first differential output line high and the second differential line low, and said transistor being further responsive to said third set of gated signals for turning said first NPN transistor on and said second PNP transistor on for pulling the second differential output line high and the first differential output line low.

10. The improved data transfer system of claim 9 wherein each of said protective means further includes first, second, third and fourth cold filament electric lighting means operatively coupled between said diodes and said first and second differential output lines for compensating the respective transistors for variations due to temperature fluctuations while simultaneously protecting those transistors from current surges and the like.

11. The improved data transfer system of claim 9 wherein said gating means includes a first logical NAND gate having its output operatively coupled to the base electrode of the first PNP transistor, a first logical AND gate having its output operatively coupled to base electrode of said first NPN transistor, a second NAND gate having its output operatively coupled to the base electrode of said second PNP transistor and a second AND gate whose output is operatively coupled to the base electrode of said second NPN transistor, said gates being arranged such that whenever said control signal is in a first state, the output of said first and second NAND gates goes high to turn off the first and second PNP transistors, respectively, and the output of the first and second AND gates goes low to turn off the first and second NPN transistors, respectively, said gates being responsive to said control signal being in a second state for enabling all of said gates such that when true data is received, the output of said first NAND gate goes low causing said first PNP transistor to conduct and pull said first differential output line high while the output of said second AND gate goes high to cause the second NPN transistor to conduct and pull the second differential output line toward ground, said gates further responding to $\overline{\text{data}}$ so that the output of the second NAND gate goes low causing the second PNP transistor to conduct and pull the second differential output line high while the output of the first AND gate goes high turning the first NPN transistor on to pull the first differential output line low.

12. The improved data transfer system of claim 6 wherein said first and second resistive means each includes a first and second resistor of approximately equal value operatively coupled between the first and second differential lines and the first and second inputs of the differential amplifier, respectively, said third and fourth resistive means including third and fourth resistors connected between the first and second inputs of said differential amplifier and the established reference potential point, said first and third resistors forming a first matched pair and said second and fourth resistors forming a second matched pair, the ratio of said first resistor to said third resistor times the value established at said reference point determining the theoretical rail-to-rail operating limits of the differential amplifier, said resistive means and said differential amplifier being responsive to the signals present on the first and second differential lines so that the reconstituted data is determined by variations in current between the lines rather than on the difference between a voltage level and ground thereby allowing the use of the present system even in applications where wide swings of ground potential are experienced.

* * * * *